United States Patent [19]
Carley

[11] Patent Number: 5,414,311
[45] Date of Patent: May 9, 1995

[54] SAMPLE AND HOLD CIRCUIT AND FINITE IMPULSE RESPONSE FILTER CONSTRUCTED THEREFROM

[75] Inventor: L. Richard Carley, Murrysville, Pa.

[73] Assignee: Carnegie Mellon University, Pittsburgh, Pa.

[21] Appl. No.: 121,282

[22] Filed: Sep. 14, 1993

[51] Int. Cl.⁶ .................... H03K 5/159; H03K 5/00; H03K 17/16
[52] U.S. Cl. ...................... 327/94; 327/552
[58] Field of Search ............. 307/352, 353, 354, 607, 307/528; 328/151, 152

[56] References Cited

U.S. PATENT DOCUMENTS

| | | | |
|---|---|---|---|
| 4,950,924 | 8/1990 | Yan | 328/151 |
| 5,148,054 | 9/1992 | Demler | 307/352 |
| 5,291,074 | 3/1994 | Nayebi | 328/151 |

OTHER PUBLICATIONS

Kenney, John G., Carnegie Mellon University, *Geometric Representation of the Tree Search Detector and its Hardware Implications*, Dec. 1991, pp. 79-97, 107-120. Pittsburgh, Pa.

*Primary Examiner*—William L. Sikes
*Assistant Examiner*—Fetsum Abraham
*Attorney, Agent, or Firm*—Kirkpatrick & Lockhart

[57] ABSTRACT

A high speed sample and hold circuit comprises an amplifier for producing an output current which is a linear function of an input voltage. A capacitor is responsive to the output current for producing an output voltage representative of the integral of the output current over a predetermined period of time. A switch selectively connects the amplifier to the capacitor during the predetermined period of time. A circuit for discharging the capacitor is also provided. A circuit for producing clock pulses controls the operation of the switch and the discharge circuit. A finite impulse response filter may be constructed around the sample and hold circuit.

4 Claims, 4 Drawing Sheets

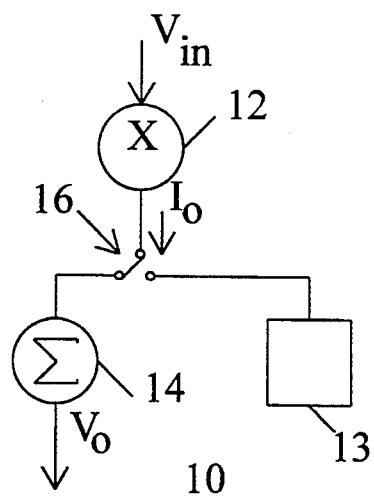
FIG. 1
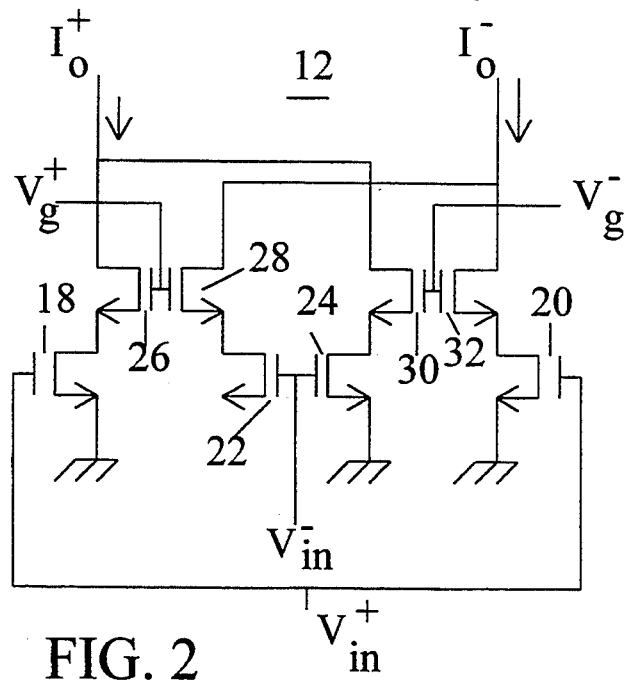
FIG. 2
FIG. 4
FIG. 3
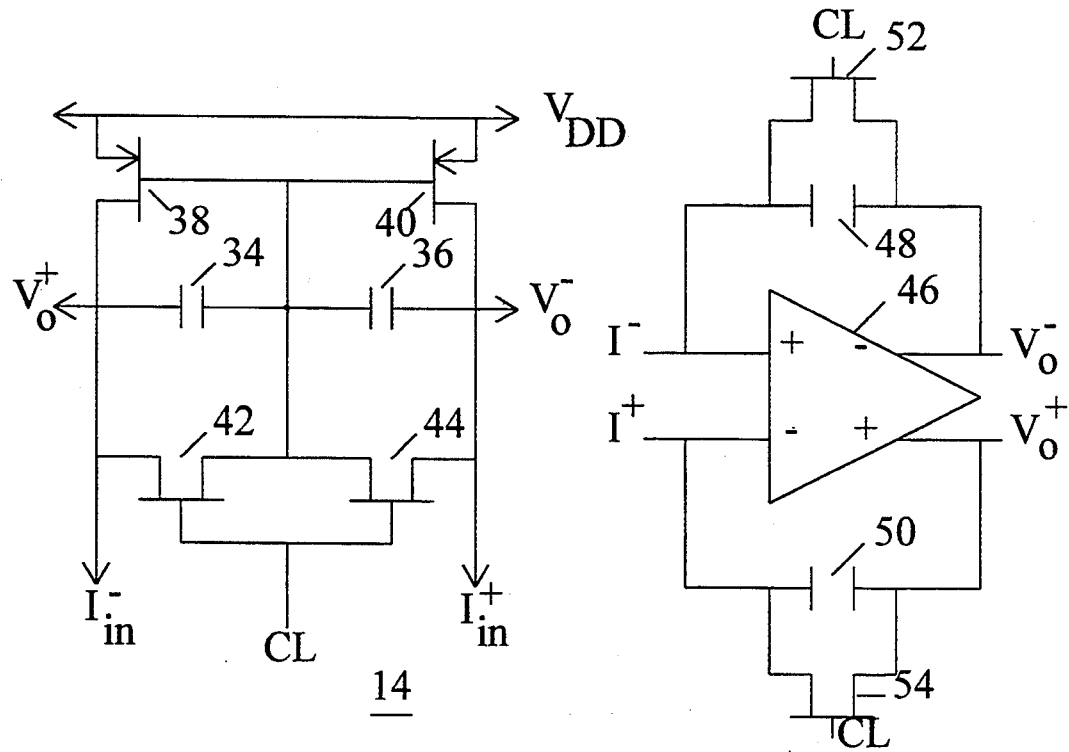

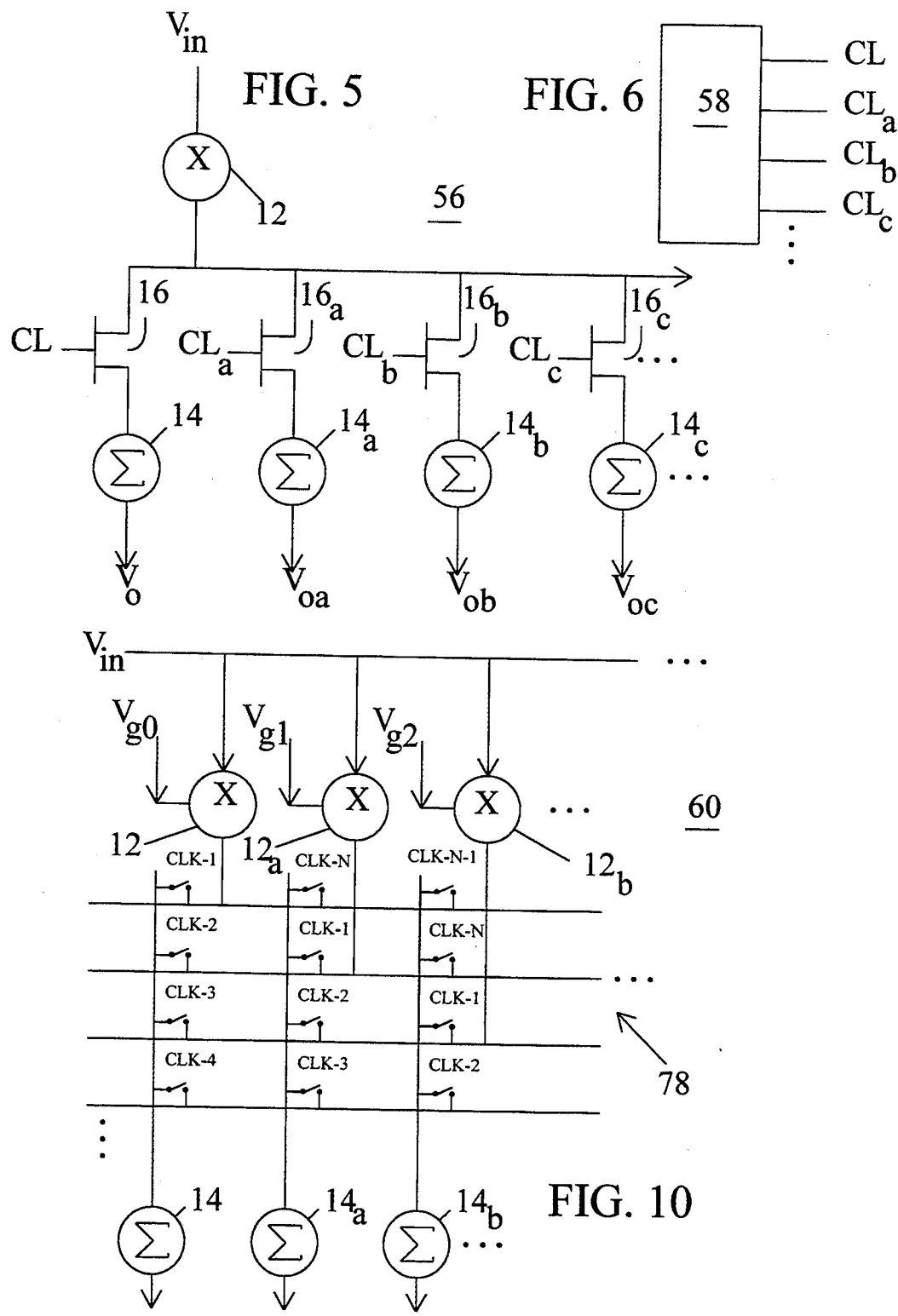

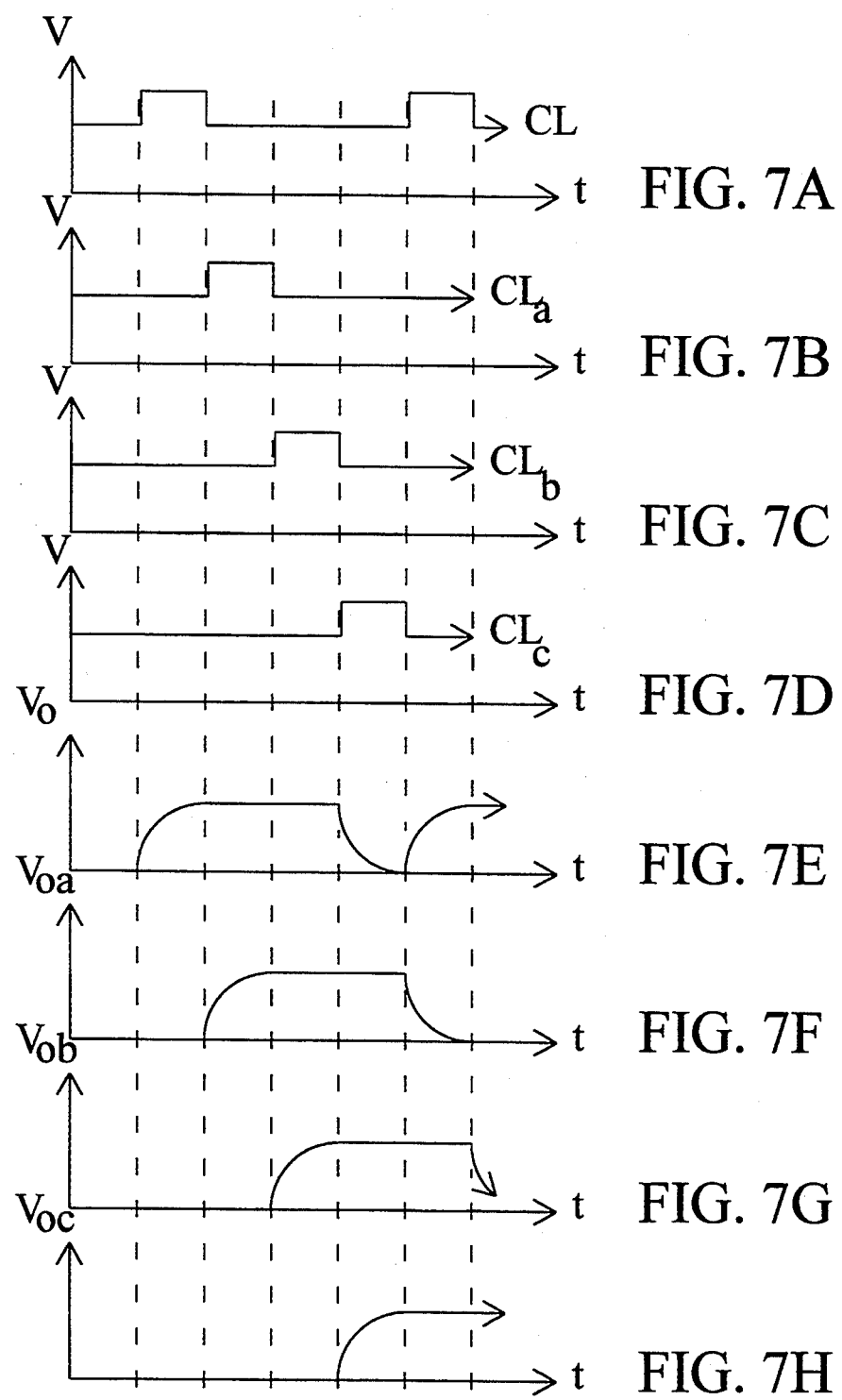

SAMPLE AND HOLD CIRCUIT AND FINITE IMPULSE RESPONSE FILTER CONSTRUCTED THEREFROM

BACKGROUND OF THE INVENTION

1. Field of the Invention

The present invention is directed generally to sample and hold circuits, and more specifically to sample and hold circuits which operate at very high frequencies. The present invention is also directed to a finite impulse response (FIR) filter which is constructed primarily of the sample and hold circuit disclosed herein.

2. Description of the Background

Sample and hold circuits are well-known circuits in the electrical art. In its simplest form, a sample and hold circuit samples a time varying input signal at a given point in time, and holds the sampled value of the input signal at an output terminal until instructed to release that value. Sample and hold circuits are often used to increase the duration of a signal for processing purposes. A sample and hold circuit can also be used for analog to digital conversion by repeatedly taking and holding samples of the time varying input signal. Often, several sample and hold circuits are provided in parallel to allow slow A/D operation and achieve a higher total sampling rate.

For the foregoing reasons, sample and hold circuits are extremely important. Such circuits often are found at the input end of complicated devices such as video receivers, radar signal processors, and medical imaging devices. As the ability of such devices to efficiently and quickly manipulate data increases, increased demands are made on the front end, i.e. the analog to digital converter, to operate at higher speeds.

Unfortunately, it is difficult to construct and operate known sample and hold circuits, at very high speeds (100 MHz). At very high speeds, sample and hold circuits are very difficult to implement because of the extremely high bandwidth which is required in the switch. Additionally, charge injection from the switch and the impact of jitter in the timing of clock pulse edges introduce errors which are unacceptable in high speed operations. Thus, the need exists for a sample and hold circuit which can accurately operate at very high speeds (100 MHz).

SUMMARY OF THE PRESENT INVENTION

The present invention is directed to a novel architecture in which an input voltage is converted to a current by an approximately linear transconductance amplifier, and that current is then fed into a capacitor (which is initially discharged) for a clock period. The sample and hold circuit's output is the voltage across the capacitor at the end of the clock period. The components which comprise the sample and hold circuit include an amplifier for producing an output current which is a linear function of an input voltage, a capacitor responsive to the output current for producing an output voltage representative of the integral of the output current over a predetermined period of time, and a current steering switch for selectively connecting the amplifier to the capacitor during the pre-determined period of time. A circuit is also provided for discharging the capacitor. In the preferred embodiment, a circuit is provided for producing clock pulses for controlling the operation of the current steering switch and for controlling the discharge of the capacitor. The integration operation inherent in the capacitor dramatically lowers the impact of both the charge injection from the switch and the impact of jitter in the timing of the clock edges.

The present invention is also directed to the use of one transconductance amplifier in conjunction with multiple switches and capacitors to convert the sample and hold circuit's output into multiple parallel outputs each sampled at a lower clock rate. That architecture is comprised of an amplifier for producing an output current which is a linear function of an input voltage, a plurality of capacitors, each responsive to the output current for producing an output voltage representative of the integral of the output current over a predetermined period of time, and a plurality of current steering switches each for selectively connecting the amplifier to one of the plurality of capacitors for a predetermined period of time. A circuit for discharging each of the capacitors is also provided. The preferred embodiment also includes a circuit for producing clock pulses for controlling the operation of the plurality of switches and for controlling the discharge of the capacitors.

The final aspect of the present invention is to modify the previously described sample and hold circuit so that the transconductance amplifier has a scale factor which is controlled by an external signal and then summing the weighted inputs from different times (different clock periods) onto the same capacitor thereby resulting in a compact, low-power, high-speed, FIR filter. That architecture is comprised of a plurality of amplifiers with each amplifier multiplying an input voltage by a predetermined weight to produce an output current representative of that multiplication. Each of a plurality of capacitors is responsive to the output currents for producing an output voltage representative of the sum of the output currents input thereto. A switch matrix is interposed between the amplifiers and capacitors for selectively connecting each of the plurality of capacitors to each of the plurality of amplifiers for predetermined periods of time. Discharge circuits are associated with each of the capacitors for selectively discharging each capacitor. The preferred embodiment includes a circuit for producing clock pulses for controlling the operation of the switch matrix and for controlling the discharge of the capacitors.

As previously mentioned, the sample and hold circuit of the present invention is capable of accurate operation at very high speeds. The FIR of the present invention is a compact, low-power device capable of accurate, high-speed operation. Those and other advantages and benefits of the present invention will be described more fully hereinbelow in the Description Of A Preferred Embodiment.

BRIEF DESCRIPTION OF THE DRAWINGS

For the present invention to be clearly understood and readily practiced, the present invention will be described in conjunction with a preferred embodiment thereof with the aid of the following figures in which:

FIG. 1 is a block diagram of a sample and hold circuit constructed according to the teachings of the present invention;

FIG. 2 is an electrical schematic of the multiplier illustrated in FIG. 1;

FIGS. 3 and 4 are electrical schematics of two embodiments of the summer illustrated in FIG. 1;

FIG. 5 is a diagram of another sample and hold circuit constructed according to the teachings of the present invention;

FIG. 6 illustrates a device for generating clock pulses;

FIG. 7–7A are timing diagram illustrating the relationship between clock pulses and output signals of the sample and hold circuit of FIG. 5;

FIG. 10 illustrates an FIR filter constructed around the sample and hold circuit illustrated in FIG. 5.

DESCRIPTION OF A PREFERRED EMBODIMENT

Figure 8:
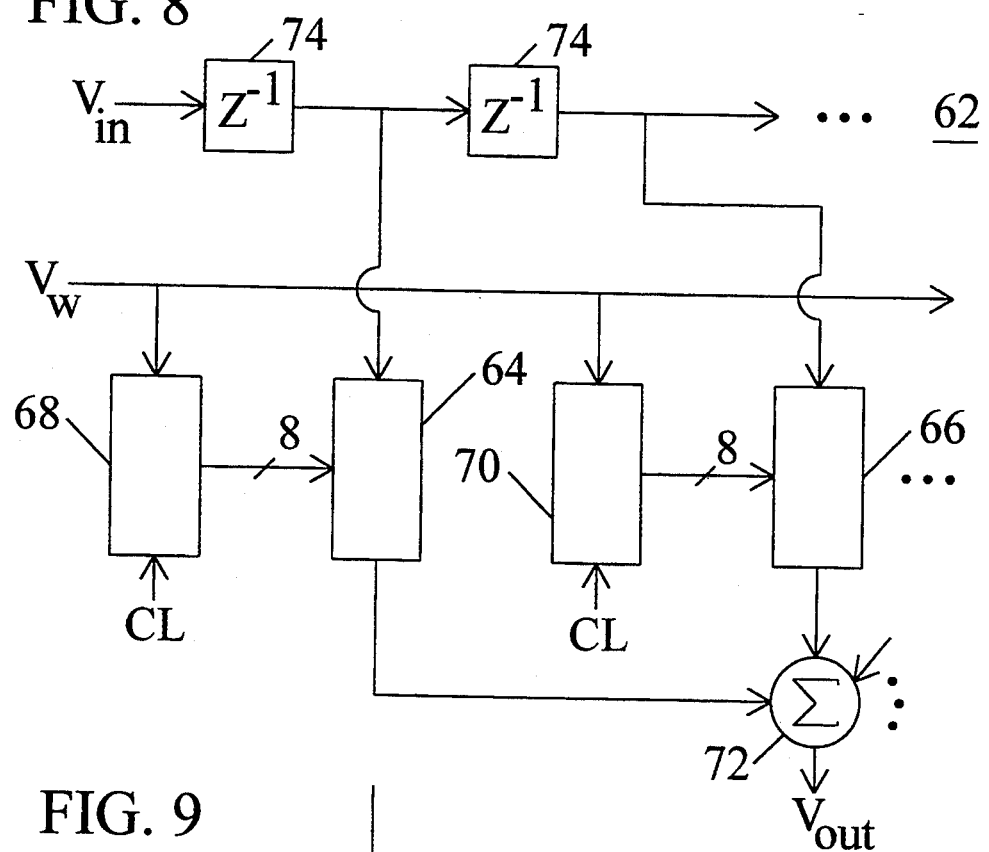
FIGS. 8 and 9 illustrate two embodiments of FIR filters.

FIG. 1 is a block diagram illustrating a sample and hold circuit 10 constructed according to the teachings of the present invention. In the sample and hold circuit 10, an input signal $V_{in}$ is input to a linear transconductance amplifier 12 which produces an output current $I_o$ which is a substantially linear function of the input voltage $V_{in}$. The output current $I_o$ is input to a summer 14 through a current steering switch 16 or to a current sink 13. The current sink 13 may be ground or, as described below, another summing device. Thus, the switch 16 is used to selectively steer the current out of amplifier 12 into summer 14 for a predetermined period of time and then to current sink 13 for another predetermined period of time. During the first predetermined period of time, the summer 14 produces the integral of the output current thereby providing an output voltage $V_o$.

The present invention thus advances a novel architecture in which the input voltage $V_{in}$ is converted to a current which is then integrated over some predetermined period to produce an output voltage. In that manner, an architecture for a sample and hold circuit is provided which allows for operation at extremely high speeds while maintaining accuracy and linear performance.

The transconductance amplifier 12 illustrated in FIG. 1 is shown in greater detail in FIG. 2. It should be understood, however, that the amplifier 12 illustrated in FIG. 2 is only one of many ways of implementing the function of amplifier 12. Any circuitry which produces an output current which is a substantially linear function of an input voltage may be substituted in place of the circuit illustrated in FIG. 2.

The circuit shown in FIG. 2 is a differential amplifier in which a positive input signal $V_{in}+$ is input to MOSFET's 18 and 20 while a negative version of the input signal $V_{in}-$ is input to MOSFET's 22 and 24. Transistors 18, 20, 22, and 24 are operated deep in the linear region where their drain current is proportional to the product of the gate voltage and the drain voltage minus a term proportional to the square of the drain voltage. MOSFET's 26, 28, 30, and 32 are provided to maintain the drains of MOSFET's 18, 22, 24, and 20, respectively, at a fixed level determined by an external signal $V_g$ input to the gate terminal of each of the transistors 26, 28, 30, and 32. An output signal $I_o+$ is available at the drain terminals of transistors 26 and 30 while an output signal $I_o-$ is available at the drain terminals of transistors 28 and 32. Because the output signal is the difference between the two output currents, the quadratic term can be ignored as it only affects the common mode output current. As is known in the art, alternatives to the circuit 12 illustrated in FIG. 2 may be designed in which either or both inputs are single ended.

FIGS. 3 and 4 illustrate two electrical schematics for the summer 14 illustrated in FIG. 1. Those of ordinary skill in the art will recognize that numerous other embodiments of the summer 14 can be developed. Any circuit configuration capable of producing an output voltage representative of the integral of the input current over a predetermined period of time can be used for the summer 14. Turning to FIG. 3, two capacitors 34 and 36 are connected back to back across signals $I_{in}-$ and $I_{in}+$. The output voltages $V_o+$ and $V_o-$ are available across capacitors 34 and 36. Two MOSFET's 38 and 40 are connected across capacitors 34 and 36 to provide common mode feedback. Two additional MOSFET's 42 and 44 are connected across capacitors 34 and 36. The gate terminals of the transistors 42 and 44 are both responsive to a clock pulse. In that manner, providing a clock pulse to the gate terminals of transistors 42 and 44 renders those transistors conductive thereby allowing capacitors 34 and 36 to discharge.

Turning to FIG. 4, a fully differential operational amplifier with common mode feedback 46 is provided. The operational amplifier 46 has a non-inverting input terminal which receives output current $I_o-$ and an inverting input terminal which receives the output current $I_o+$. The operational amplifier 46 has an inverted output terminal at which is available the output signal $V_o-$ and a non-inverted output terminal at which is available the output signal $V_o+$. Connected across the non-inverting input terminal and the inverted output terminal is a capacitor 48. Connected across the inverting input terminal and the non-inverted output terminal is a capacitor 50. The capacitor 48 has a MOSFET 52 connected thereacross while the capacitor 50 has a MOSFET 54 connected thereacross. The gate terminals of the transistors 52 and 54 are responsive to clock pulses for controlling the discharge of capacitors 48 and 50, respectively.

In operation, current steering switch 16 is implemented with a MOSFET (not shown in FIG. 1), or two MOSFET's (not shown) if differential circuits such as those shown in FIGS. 2, 3, and 4 are used. The gate terminals of the transistors used to implement switch 16 are responsive to a clock pulse. During the time that the clock pulse is in one state, the transistors implementing switch 16 are conductive and the capacitors 34 and 36 or 48 and 50 of FIGS. 3 and 4, respectively, will charge as a result. During the time when the clock pulse is in a second state, the output signal must be measured and stored and the capacitors discharged to enable another sample to be taken and held. It is thus seen that the summer 14 must be operated at very high speeds.

To allow the summer 14 to be operated at lower speeds than those required in the embodiment of FIG. 1, another embodiment of a sample and hold circuit 56 constructed according to the teachings of the present invention is illustrated in FIG. 5. In FIG. 5, components performing the same function as those illustrated in the previous figures are provided with the same reference numerals. In FIG. 5, it is seen that additional switches 16a, 16b, and 16c are provided as are additional summers 14a, 14b, and 14c. In that manner, the output of amplifier 12 can be serially input to summer 14 through switch 16, summer 14a through switch 16a, summer 14b through switch 16b, etc.

In FIG. 6, a circuit 8 of a known construction for producing clock pulses is used to produce clock pulses CL, CL$_a$, CL$_b$ and CL$_c$. The relationship between the four clock pulses is shown in FIGS. 7A–7D. The clock pulses may be, for example, operating at a frequency of 100 MH$_z$. When the clock pulse is "low", it assumes a voltage of, for example, 2.5 volts, while the voltage is, for example, 3 volts when the clock pulse goes "high". As is shown, there is no overlap in the high states of the clock pulses. The clock pulses in FIGS. 7A–7D may be used to control a sample and hold circuit 56 of the type illustrated in FIG. 5.

Assuming that the sample and hold circuit 56 of FIG. 5 is constructed as shown wherein MOSFET's are used to implement switches 16, 16a, 16b, and 16c, the time during which clock pulse CL is high indicates the time during which the summer 14 is connected to multiplier 12. During that time period, summers 14a, 14b, and 14c are not connected to multiplier 12 and the capacitor in summer 14 begins to charge as shown in FIG. 7E. After the clock pulse CL goes low, clock pulse CL$_a$ will go high thereby connecting summer 14a to multiplier 12. During that time, the output voltage V$_o$ shown in FIG. 7E available at the output of summer 14 may be sampled and the capacitor in summer 14a begins to charge as shown in FIG. 7F. Thereafter, clock pulse CL$_a$ goes low and clock pulse CL$_b$ goes high. During that time period, the output voltage V$_o$ produced by summer 14 and shown in FIG. 7E may continue to be sampled as well as the output signal V$_{oa}$ shown in FIG. 7F. When clock pulse CL$_b$ goes low, clock pulse CL$_c$ goes high as shown in FIG. 7D thereby connecting summer 14c to multiplier 12 as shown in FIG. 7H. During that period of time, the capacitor in summer 14 may be discharged as shown in FIG. 7E and the voltages V$_{ob}$ and V$_{oc}$ available at summers 14b and 14c, respectively, may be sampled. In that manner, one transconductance amplifier 12 is used in conjunction with multiple switches 16, 16a, 16b, and 16c and multiple summers 14, 14a, 14b, 14c to provide a sample and hold circuit 56 having parallel outputs each sampled at a lower clock rate. That provides more time for measuring of the output signals V$_o$, V$_{oa}$, V$_{ob}$, and V$_{oc}$ and more time for discharging of the capacitor within each of the summers.

The reduction in bandwidth resulting from this new sample and hold circuit can be clearly seen in FIGS. 7E–7H. Each output signal is available for two full clock periods. More summers may be used in parallel to further lower the bandwidth at each summer's output.

The architecture of the sample and hold circuit illustrated in FIG. 5 may be expanded to produce a finite impulse response (FIR) filter. FIG. 8 is a block diagram illustrating an FIR filter 62 which I constructed several years ago. In FIG. 8, the input signal V$_{in}$ is repeatedly sampled by sample and hold amplifiers 74, and each of the samples is input to a multiplier 64, 66, etc. Each multiplier 64, 66 has a shift register 68, 70, etc. associated therewith. The shift registers 68, 70 are loaded with a weight factor provided by signal V$_w$. The weight factor for each shift register 68, 70 is clocked in via a clock pulse. In that manner, each multiplier 64, 66 has associated therewith a weight, which is multiplied with the signal sample. The output of each of the multipliers is input to a summer 72 which produces the resultant output signal V$_{out}$.

Based on my experience with that design, I have learned that the process of sampling the input signal V$_{in}$ through numerous sample and hold amplifiers 74 adds a certain amount of noise and distortion which eventually becomes unacceptable. To avoid such repeated sampling of the input signal, the FIR filter 62 of FIG. 8 can be redesigned as shown by the FIR filter 76 in FIG. 9.

Figure 9:
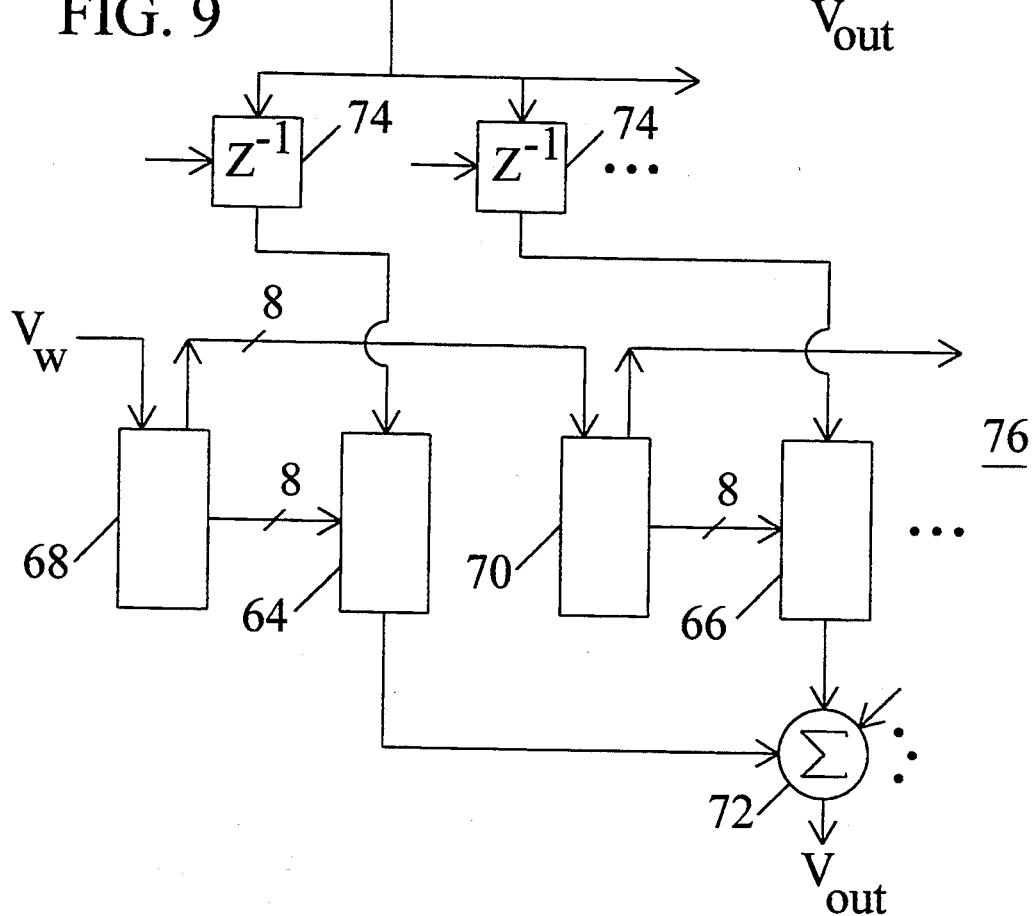

In the circuit 76 illustrated in FIG. 9, the components have been rearranged so that the weight values circulate from one shift register to the next. In implementing the circuit of FIG. 9, digital, parallel shift registers 68, 70 provide the weight factors and multipliers with one digital input (for the weight) and one analog input (for the signal) perform the multiplication. That type of multiplier is frequently referred to as a multiplying digital-to-analog converter (MDAC). Testing of various multiplier implementation methodologies indicated that multipliers which multiply two analog signals together can achieve higher band width and lower power dissipation than MDACs.

Turning now to the FIR 60 illustrated in FIG. 10, it can be seen that the circuit 60 is an extension of the circuit 56 illustrated in FIG. 5. In the architecture shown in FIG. 10, the sample and hold operation is merged within an analog multiplication operation to achieve extremely high operating speeds. In FIG. 10, each of the multipliers 12, 12a, 12b, etc. receives the input signal V$_{in}$ as well as a gain signal V$_{go}$, V$_{g1}$, V$_{g2}$, etc., respectively, representative of the weight which is to be multiplied with the input signal. The currents output from each of the multipliers 12 are input to a switch matrix 78. The switch matrix 78 enables each of the multipliers 12, 12a, 12b to be connected to each of the summers 14, 14a, 14b, depending upon the status of the switching matrix 78. The switching matrix 78 is controlled by a plurality of clock pulses of the type illustrated in FIG. 7A–7D. Similarly, the discharging of the capacitors within summers 14, 14a, 14b are also controlled by clock pulses of the type illustrated in FIG. 7A–7D as previously described.

I refer to the FIR filter 60 illustrated in FIG. 10 as an integrating FIR filter because the output signal from the multiplier is a current and the summations performed by summers 14, 14a, 14b are performed by switching the current into a capacitor which sums the charge. The integrating FIR filter architecture has many advantages. For example, the switch matrix 78 can be comprised of ECL-like current steering switches rather than the much slower voltage mode switches. In addition, the architecture has a parallel output that is updated at a much lower clock rate which allows for simplification of subsequent circuitry.

Advanced digital signal detection algorithms for communications channels and magnetic recording channels typically require that the channel be equalized using an adaptive FIR equalizer. Currently, nearly all implementations of that have been performed using A/D conversion followed by a digital FIR implementation using multipliers. The power/FIR tap at 100 MHz clock rate is typically at least 50 mW. Applications such as lap top disc drives require clock rates of 100 MHz FIR filters with 40 taps, and total power dissipation of at most 100 mW. The present invention can achieve those goals. Moreover, because of the large gulf between the current state of the art of digital implementations and the present invention, over a factor of 10 in power dissipation, it is unlikely that digital scaling will diminish the significance of the improvement achieved by the present invention.

The high speed sample and hold operation of the present invention is important in any application in which high speed conversion of information from analog to digital form is required. The FIR filter operation provides low power, high speed equalization for digital detectors in a wide range of communications and recording applications, particularly those in which minimizing power consumption is important, e.g., portable/battery powered applications.

While the present invention has been described in conjunction with preferred embodiments thereof, many modifications and variations will be apparent to those of ordinary skill in the art. This disclosure and the following claims is intended to cover all such modifications and variations.

What I claim is:

1. A high speed sample and hold circuit, comprising:

amplifier means for producing an output current which is a linear function of an input voltage;

capacitor means responsive to said output current for producing an output voltage representative of the integral of said output current over a predetermined period of time;

switch means for selectively connecting said amplifier means to said capacitor means during said predetermined period of time;

discharge means connected to said capacitor means for discharging said capacitor means after said predetermined period of time;

means for producing clock pulses for controlling the operation of said discharge means and said switch means.

2. The sample and hold circuit of claim 1 wherein said amplifier means includes a differential transconductance amplifier constructed of MOSFET's.

3. A high speed sample and hold circuit, comprising:

amplifier means for producing an output current which is a linear function of an input voltage;

a plurality of capacitor means responsive to said output current for producing an output voltage representative of the integral of said output current over a predetermined period of time;

a plurality of switch means, each for selectively connecting said amplifier means to one of said plurality of capacitor means for a predetermined period of time;

a plurality of discharge means, one associated with each of said capacitor means for selectively discharging said capacitor means; and means for producing clock pulses for controlling the operation of said plurality of switches and said plurality of discharge means.

4. A finite input response filter, comprising:

a plurality of amplifier means, each for multiplying an input voltage with a predetermined weight to produce an output current representative of said multiplication;

a plurality of capacitor means, each responsive to said output currents for producing an output voltage representative of the sum of the output currents input thereto;

switch matrix means for selectively connecting each of said plurality of capacitor means to each of said plurality of amplifier means;

a plurality of discharge means, one associated with each of said capacitor means for selectively discharging said capacitor means; and means for producing clock pulses for controlling the operation of said switch matrix means and said plurality of discharge means.

* * * * *

UNITED STATES PATENT AND TRADEMARK OFFICE
CERTIFICATE OF CORRECTION

PATENT NO. : 5,414,311
DATED : May 9, 1995
INVENTOR(S) : L. Richard Carley

It is certified that error appears in the above-indentified patent and that said Letters Patent is hereby corrected as shown below:

Col. 3, line 6, delete "7-7A" and substitute -- 7A-7H--.

Col. 4, line 67, delete "8" and substitute --58--.

Signed and Sealed this

Third Day of October, 1995

BRUCE LEHMAN

Attest:

Attesting Officer

Commissioner of Patents and Trademarks